United States Patent [19]

Reitman et al.

[11] Patent Number: 5,654,903
[45] Date of Patent: Aug. 5, 1997

[54] METHOD AND APPARATUS FOR REAL TIME MONITORING OF WAFER ATTRIBUTES IN A PLASMA ETCH PROCESS

[75] Inventors: Edward A. Reitman, Madison; Dale E. Ibbotson, Bridgewater, both of N.J.; Tseng-Chung Lee, New York, N.Y.

[73] Assignee: Lucent Technologies Inc., Murray Hill, N.J.

[21] Appl. No.: 553,118

[22] Filed: Nov. 7, 1995

[51] Int. Cl.$^6$ .............................. H05H 1/00; G05B 13/04
[52] U.S. Cl. .................. 364/551.01; 156/625.1; 156/626.1; 395/21; 395/22; 216/67; 364/468.28; 438/9
[58] Field of Search .......................... 364/551.01, 569, 364/580, 578; 156/625.1, 626.1, 627.1, 643.1; 395/21, 22, 68; 216/63, 67, 59, 60

[56] References Cited

U.S. PATENT DOCUMENTS

| | | | |
|---|---|---|---|
| 4,493,745 | 1/1985 | Chen et al. | 156/626 |
| 5,282,261 | 1/1994 | Skeirik | 364/164 |
| 5,355,320 | 10/1994 | Erjavic et al. | 364/488 |
| 5,399,229 | 3/1995 | Stefani et al. | 156/626 |
| 5,451,289 | 9/1995 | Barbee et al. | 216/59 |
| 5,467,883 | 11/1995 | Frye et al. | 216/60 |
| 5,500,073 | 3/1996 | Barbee et al. | 156/345 |
| 5,526,293 | 6/1996 | Mozunder et al. | 364/578 |
| 5,582,746 | 12/1996 | Barbee et al. | 216/86 |

OTHER PUBLICATIONS

Donnelly, V.M., "Optical Diagnostic Techniques for Low Pressure Plasmas and Plasma Processing," Plasma Diagnostics vol. 1 Discharge Parameters and Chemistry, Academic Press, New York (1989).

Rietman, E.A. and Lory, E.R., "Use of Neural Networks in Semiconductor Manufacturing Processes: An example for Plasma Etch Modeling," IEEE Trans. on Semi. Cond. Manuf., 6(4), 343–347 (1993).

Rietman, E.A., Frye, R.C., Lory, E.R. and Harry, T.R., "Active Neural Network Control of Wafer Attributes in a Plasma Etch Process," JVST B–11(4), 131–1316 (1993).

Rietman, E.A., Patel, S.H. and Lory, "Neural Network Control of a Plasma Etch Process," JVST B–11(4), 1314–1316 (1993).

Urban, III, F.K., and Tabet, M.F., "Development of Artificial Neural Networks for in situ Ellipsometry of Films Growing on Unknown Substrates," J.V.S.T. 1952–1956 (1994).

Primary Examiner—James P. Trammell
Assistant Examiner—Bryan Bui

[57] ABSTRACT

The present invention provides a method and apparatus for monitoring the state of an attribute of a product during the manufacturing process. The invention employs an intelligent system trained in the relationship between the signatures of the manufacturing process and the product attribute as a function of time. In one embodiment the intelligent system comprises two intelligent systems: the first, trained in the relationship between the signatures of the manufacturing process and one or more signatures of the state of the attribute as a function of time; and the second, trained in the relationship between the product-state signatures as a function of time and the product attribute as a function of time. The disclosed apparatus can be an integral part of the manufacturing machinery allowing the process to continue until the exact moment when the desired state is achieved.

25 Claims, 12 Drawing Sheets

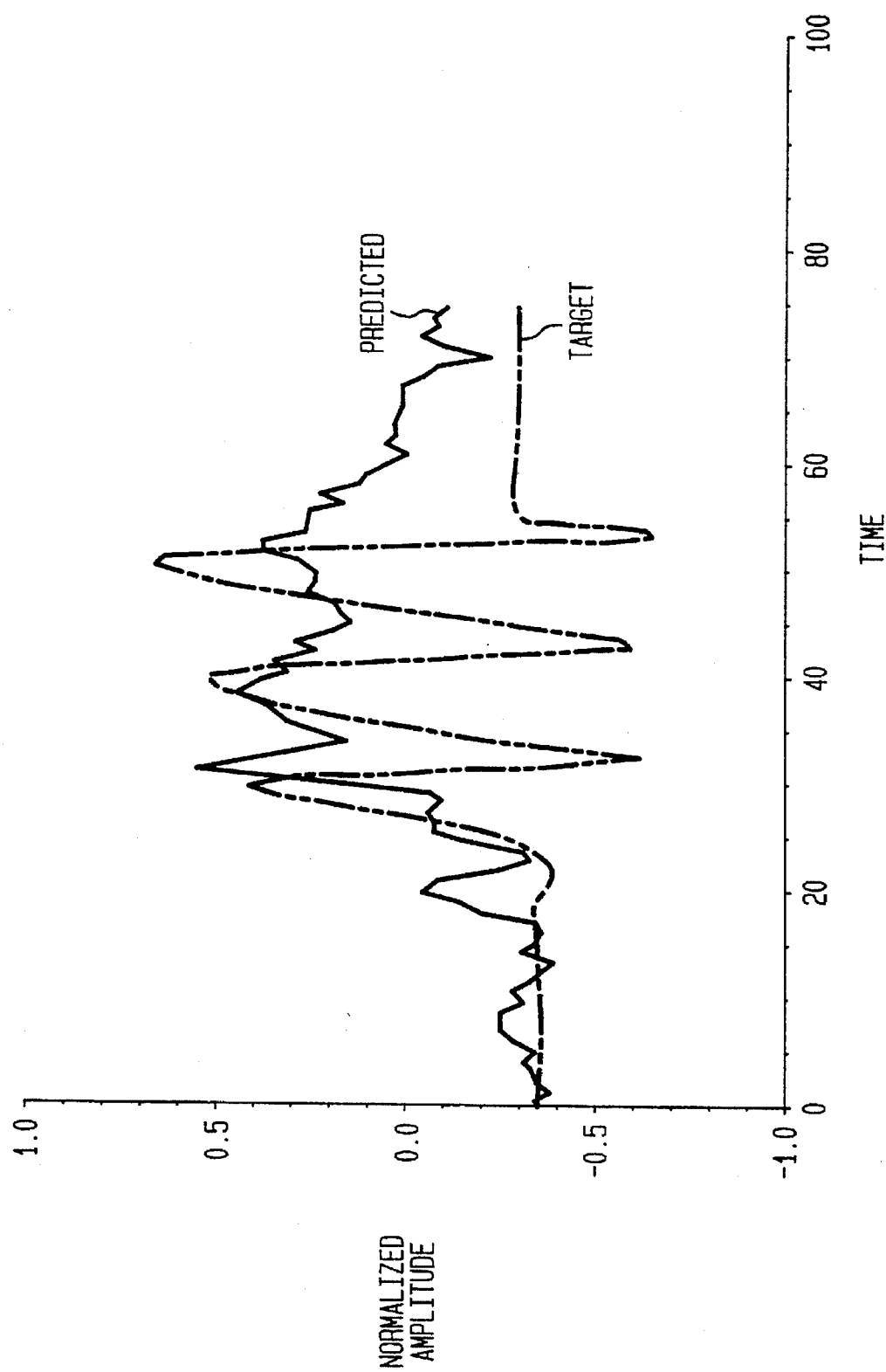

METHOD AND APPARATUS FOR REAL TIME MONITORING OF WAFER ATTRIBUTES IN A PLASMA ETCH PROCESS

TECHNICAL FIELD

The invention described and claimed herein relates to methods and apparatus for monitoring and determining in real-time, the state of selected attributes of semiconductor wafers, such as film thickness, line width and line profile.

BACKGROUND OF THE INVENTION

In the manufacture of semiconductor wafers, plasma etching is a process for transferring circuit patterns from the surface of a semiconductor wafer to an underlying layer by using a highly reactive ionized gas to remove unmasked portions of the wafer. As in most manufacturing processes, quality control of a desired product attribute is necessary. In integrated circuit ("IC") manufacturing a key wafer attribute is the post etch thickness of a film on the wafer. Overetching can adversely effect the performance of the final device.

Plasma etch processing can result in variances in post etch film thickness from lot to lot (for example, 10 to 50 wafers processed in sequence) and wafer to wafer for several reasons. One source for these variations is the fluctuations over time of the variables which control the plasma etch machine, such as applied RF power, gas pressure and gas flow rates. The age of the reactor is another factor known to affect the etch time for a desired thickness. In addition, variations in the pattern densities for different wafers also affect the final film thickness.

One prior art method for controlling film thickness is to inspect and measure the etch of prior lots of wafers and adjust the etch time for subsequent lots. This obviously entails interrupting production between lots, manual measurements of a sample and statistical analysis. In addition to interrupting the manufacturing process, this method fails to monitor the process in real time and does not provide a means for determining film thickness on an individual wafer.

A more recent and sophisticated control device and method is described in Edward A. Rietman et at., *Active Neural Network Control of Wafer Attributes in a Plasma Etch Process*, 11 J. Vac. Tech. B at 1314 (1993), incorporated as if set forth fully herein, in which a neural network is used to predict the ideal etch time for a desired thickness. The authors show that a relationship exists between the optical emission trace from the plasma glow and the ideal etch time for a desired film thickness. The neural network is trained to learn the relationship between the emission trace over a set period of time and the optimum etch time for a desired thickness. After training, optical emission measurements can be entered into the neural network which then predicts the ideal etch time for the current wafer being processed. The emission trace measurements are collected for approximately one third of the total expected etch time so that sufficient time remains to input the data to the neural network and receive from it the predicted ideal etch time long before the desired thickness is obtained.

In further work for predicting ideal etch time for wafers with ever smaller circuit features, Rietman et at., demonstrated that inputting to the neural network the mean value of fluctuations for various variables of the prior and current plasma etch process in addition to the emission trace measurements, enhances the convergence of the neural network. Edward A. Rietman et at., *Neural Network Control Of a Plasma Gate Etch: Early Steps in Wafer-To-Wafer Process Control*, Int'l. Electronics Manufacturing, Technology Symposium at 454 (IEEE/CHMT 1993) incorporated as if set forth fully herein. The input variables for the current wafer include: applied and reflected RF power; dc bias; gas flow rates; reactor pressure; and time to generate the emission trace. The input variables of the prior lot include: observed thickness; observed etch time; applied RF power; and dc bias.

The neural network methods described above represent a significant technological step forward in controlling oxide film thickness. By eliminating human intervention and collecting data in situ, the etching process is allowed to continue from lot to lot without interruption. Moreover, a method is available for determining the ideal etch time for a particular wafer being processed based on data obtained from the current wafer and previous lot.

Notwithstanding its advances, the above methods use process signatures from a point in time, t, and time delayed signals to predict a future time, t+i, when the desired thickness will be reached. In situ monitoring of the wafer attributes in real-time, i.e. determining at time t the present film thickness, line width or line profile, as well as other attributes, is available only with expensive diagnostics. The subject invention provides a method and apparatus whereby the state of a wafer attribute, such as film thickness, line width or line profile, can be monitored in real time by using intelligent systems, such as neural networks, trained in the relationship between signatures representing the changing process variables, process state changes, and signatures representing the state of the wafer attribute. This approach avoids the use of expensive on-line diagnostics.

SUMMARY OF THE INVENTION

The subject invention provides a method and apparatus employing an intelligent system trained in the relationship between process signatures (a characterization of the variables that affect the manufacturing process of a product) as a function of time and product attributes as a function of time.

In one embodiment, the intelligent system of the subject invention comprises two intelligent systems: the first, trained in the relationship between process signatures as a function of time and product-state signatures (a characterization of the state of the object of a manufacturing process) as a function of time; and the second, trained in the relationship between product-state signatures as a function of time and product attributes as a function of time.

One or more process signatures are selected which characterize the manufacturing process of a product such as a semi-conductor wafer, and which have a relationship to the state of a predetermined attribute of the product. Product-state signatures are also selected, which characterize the attribute.

BRIEF DESCRIPTION OF THE DRAWINGS

FIGS. 10A and 10B illustrate examples of predicted vs actual results.

DETAILED DESCRIPTION

Figure 1:
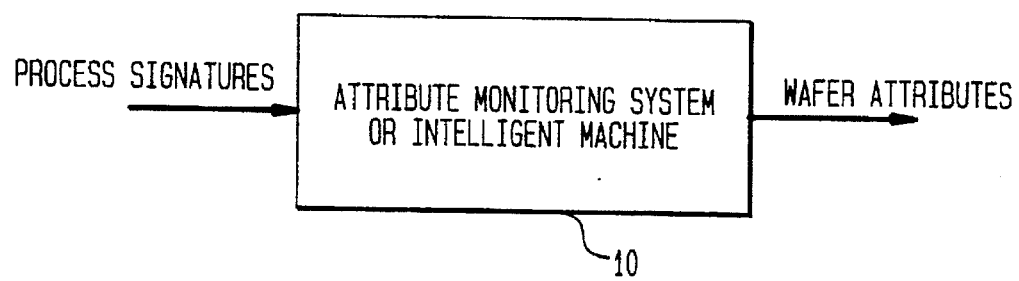
FIG. 1 schematically depicts a real-time wafer attribute monitoring system according to the present invention.

Referring now to FIG. 1 a real-time wafer attribute monitoring system 10 is depicted according to one embodiment of the invention. An intelligent system trained in the relationship between the manufacturing process signatures and the product attribute receives the process signatures and provides the wafer attribute as a function of time as its output.

Figure 2:
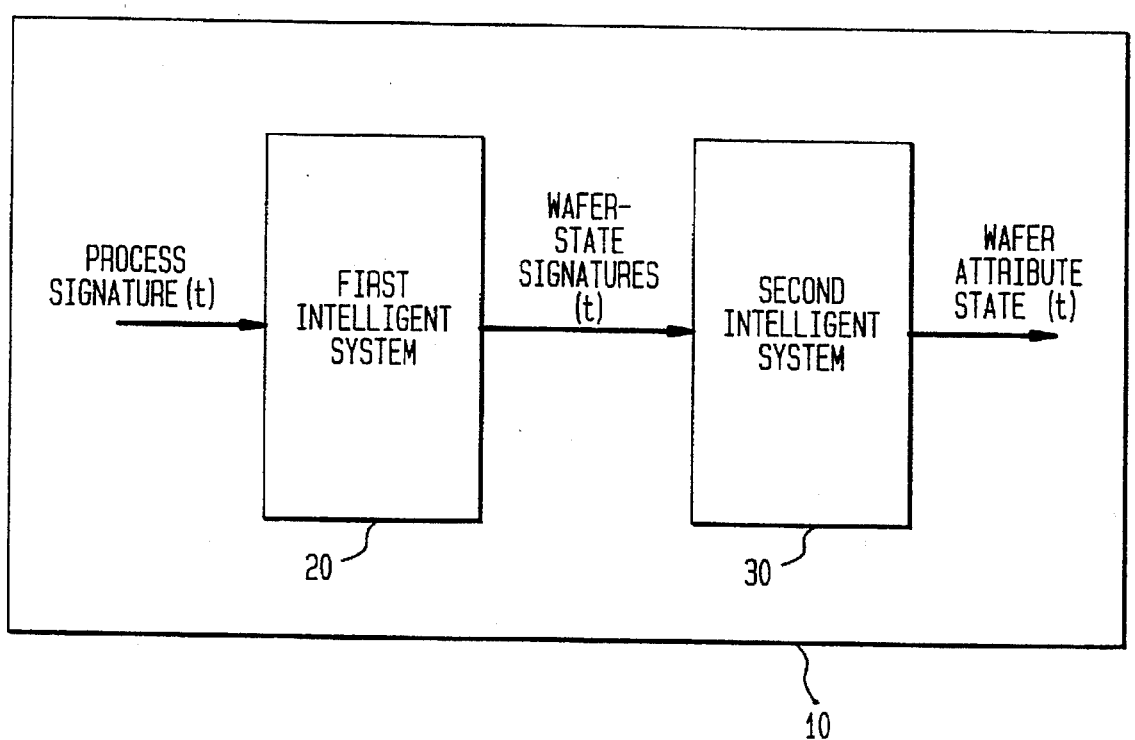
FIG. 2 schematically depicts one embodiment of the present invention employing two intelligent systems.

FIG. 2 depicts a real-time wafer-attribute monitoring system 10 according to a second embodiment of the invention. The monitoring system 10 comprises two principal components: a first intelligent system 20 and a second intelligent system 30. The properties and parameters of the wafer attribute manufacturing process ("process signatures") are inputted over a period of time to the first intelligent system 20, whose output represents one or more wafer-state signatures as a function of time. Second intelligent system 30 receives the wafer-state signatures as a function of time produced by the first intelligent system 20 and outputs the wafer attribute state as a function of time.

Figure 3:
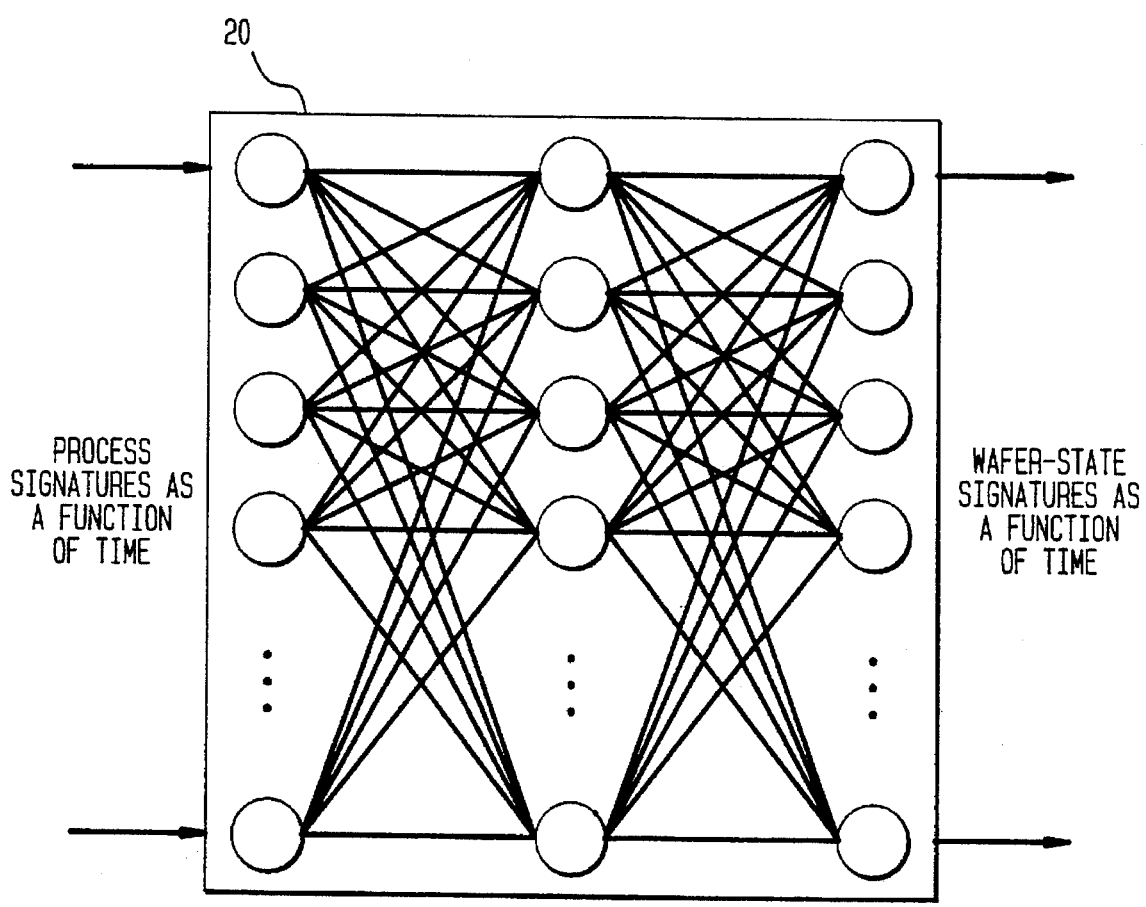
FIG. 3 depicts a neural network as one embodiment of an intelligent system, trained in the relationship between the process signatures over time and wafer-state signatures as a function of time.

FIG. 3 depicts one embodiment of first intelligent system 20 as a neural network. As used herein, the expression "intelligent system" refers to any system which is capable of adaptive learning, i.e., learning which is adjusted to accommodate changing circumstances. Examples of intelligent systems are systems which employ artificial intelligence (e.g. machines capable of imitating intelligent human behavior) and neural networks. Neural networks include systems which can learn through trial and error processes. Typically, neural networks employ parallel processing elements interconnected such that the network simulates higher order information processing. As depicted in FIG. 3, the first intelligent system 20 can be a neural network comprising two or more layers of nodes. The process signatures are entered at the first layer and the wafer-state signatures are available from the last layer. Other intelligent systems include recurrent networks and time delay networks. Further description of the operation of neural networks, recurrent networks and time delay networks, is found in R. H. Nielson, *Neurocomputing*, (Addison-Wesley, 1990) and *Backpropagation Theory, Architectures and Applications* (eds. Chauvin and Rumelhart 1995) the disclosures of which are incorporated by reference as if set forth fully herein.

One embodiment of the present invention provides a means to monitor the post etch thickness of a thin film on a semiconductor wafer during plasma etch processing. In plasma etch processing, the process signatures may include the fluctuations over time of the plasma etch machine prometers, the changes in the plasma properties as a result of the machine parameter fluctuations, the plasma reactor matching network changes which result from changes over time in the plasma properties, or some combination thereof. The etching machine parameters which fluctuate about a set point include RF power, gas pressure, and flow rate of the reacting gases. The plasma properties affected by these fluctuations include electron temperature and optical emission. The resulting network changes include de-bias and reflected RF power.

Where the subject invention is to be used to monitor the wafer film thickness during its processing, a time trace of the ellipsometric and/or interferometric data are useful wafer-state signatures. Interferometry and ellipsometry provide diagnostic information concerning film thicknesses. Interferometry is a technique whereby a monochromatic light beam of wavelength $\lambda$ interacts with a film of thickness d, refractive index $n_1$, and absorption coefficient k. Interferences occur when the penetration depth is greater than the optical path through the film. This relation is given by $$\frac{\lambda}{4\pi k} \geq \frac{2nd}{\cos\theta_1}$$

where $\theta_1$ is the reflection angle of the beam inside the film and is given by Snell's Law $$\eta_0 \sin \theta_0 = \eta_1 \sin \eta_1$$

In this relation $\eta_0$ is the refractive index of the incident medium (e.g. substrate or vacuum) and $\eta_1$ is the refractive index of the thin film. The angle of incidence of the light beam is represented by the symbol $\theta_0$. The reflected beam intensity, $\theta_1$, will oscillate sinusoidally due to interference. This oscillation is given by $$\Delta d = \frac{\lambda}{2\sqrt{n^2 - \sin^2\theta_1}}$$

An interferogram of an etching film will show an increasing number of fringes as time increases, indicating a change in film thickness as a function of time. Thus, a point in time t on an interferometry trace as a function of time, conveys information about the film thickness at time t. In other words, film thickness can be determined in real-time from the interferometry trace. This mapping relation can be represented by $$I(t) \rightarrow W(t)$$

where I(t) is the interferometry function (or set of data points) as a function of time and W(t) is the film thickness function with respect to time.

Ellipsometry has the added advantage of being able to provide information on film thickness for very thin films (<30 Angstroms). Ellipsometry is a technique whereby the physical properties of a sample are determined from the change in polarization of light, incident upon a specular surface of that sample. Further description of Ellipsometry can be found in O. Auciello and D. L. Flam, 2 *Plasma Diagnostics* (Academic Press, 1989), the disclosure of which is incorporated by reference herein.

The complex reflectance ratio is given by $$\rho = (\tan \psi) e^{i\Delta}$$

where $\psi$ represents the ratio of the amplitude of the parallel and perpendicular components of the radiation and $\Delta$ represents the phase change in these two components. Since both $\psi$ and $\Delta$ change with respect to time we can develop a complex mapping relation between these two variables and the thickness of the thin film with respect to time.

$$E(\psi, \Delta, t) \rightarrow W(t)$$

where W(t) is the film thickness as a function of time and E ($\psi$, $\Delta$, t) is the complex ellipsometry function of $\psi$, $\Delta$ and time.

Since as explained above, a causal relationship is known to exist between the time trace of the interferometric and ellipsometric data of a film during processing and its thickness, an intelligent system such as a neural network can be trained in the relationships $$I(t) \rightarrow W(t)$$

and $$E(\Omega, \Delta, t) \rightarrow W(t)$$

and taught to predict the wafer attribute or film thickness at a given time. All that remains is to predict the interferometric and/or ellipsometric data as a function of time.

As stated above, prior art work has shown that it is possible to map a set of plasma process signatures (e.g. flow rate, pressure, applied RF power, reflected RF power, dc-bias, and optical emission trace) to the final post etch film thickness. If we represent this set of signatures as M, then that work can be represented symbolically as:

$$M \rightarrow W$$

where W is the film thickness at the end of the etch and M is the set of plasma process signatures. To monitor the state of the attribute as a function of time, however, the process signatures as a function of time must be mapped to the attribute state as a function of time. This can be done with a single intelligent system as depicted in FIG. 1.

A preferred method, however, maps the set of process signatures, M at a time t and thickness, W, at a time t, in two steps. The first step maps M to either the ellipsometry data as a function of time $$M(t) \rightarrow E(\psi, \Delta, t)$$

or an interferometry mapping $$M(t) \rightarrow I(t)$$

and the second step maps either the ellipsometry data as a function of time to the wafer attribute or film thickness as a function of time $$E(\psi, \Delta, t) \rightarrow W(t)$$

or the interferometry data as a function of time to the wafer attribute or film thickness as a function of time.

$$I(t) \rightarrow W(t)$$

The result is a dynamic map of M(t) to wafer film thickness as a function of time, W(t).

Figure 4:
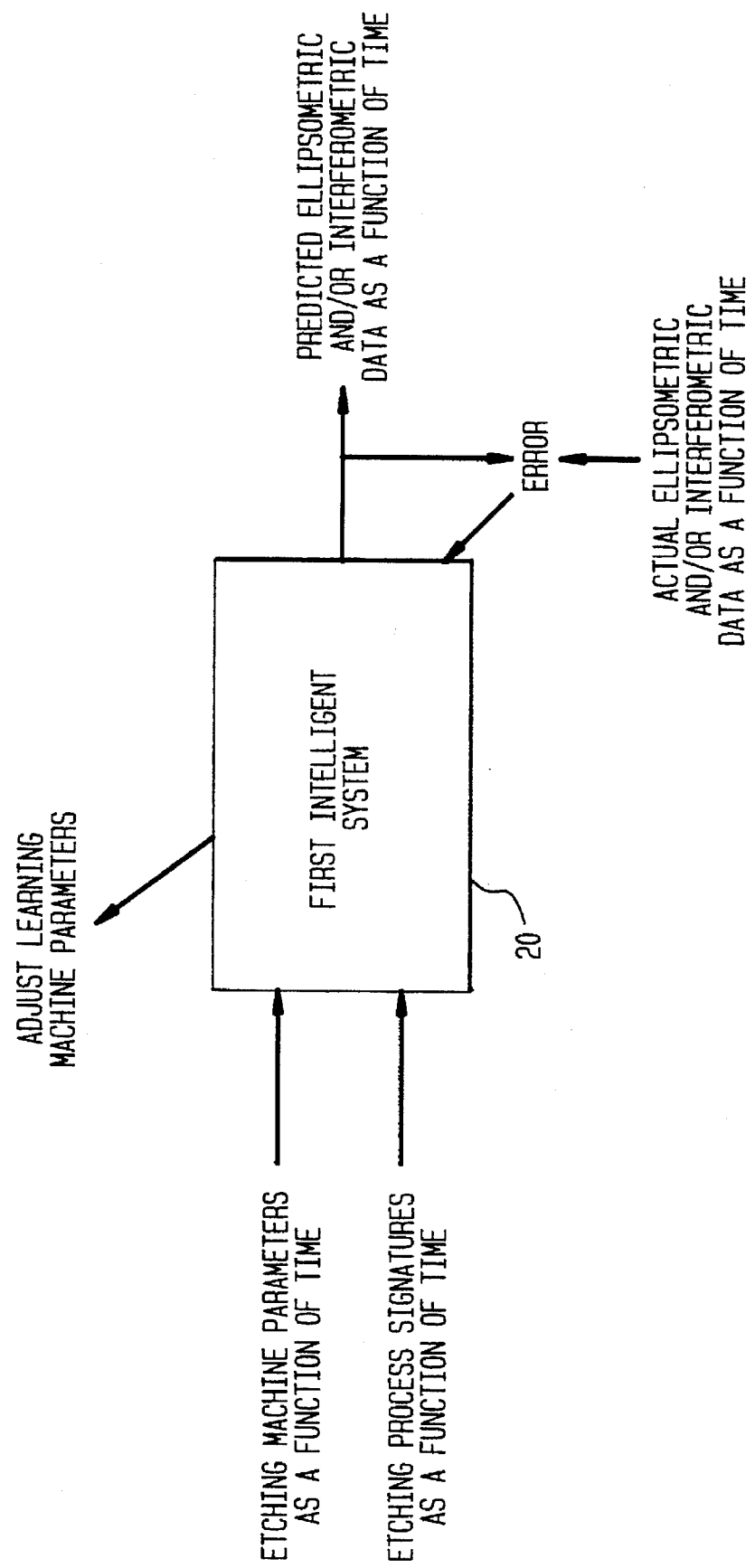
FIG. 4 schematically depicts the intelligent system training in the relationship between the process signatures and the wafer-state signatures.

As shown in FIG. 4, first intelligent system 20 is trained in the relationship between selected process signatures and one or more selected wafer-state signatures. Thus, the first intelligent system 20 will be trained in the relationship between the plasma etch process signatures over a period of time and the ellipsometric and interferometric time trace for the same period of time.

In an exemplary embodiment, first intelligent system 20, as well as second intelligent system 30 comprise a neural network. It is emphasized, however, that any adaptive or statistical learning system can be employed as an intelligent system for the present invention.

The process signatures input to the first intelligent system 20 include the etching machine parameters (i.e. set-point fluctuations in time) and etching process signatures (e.g. dc-bias, optical emission) as functions of time. Additionally, there may be inputs representing the material structures of the films and pattern density information. (Although, pattern density information should be an implicit part of the etching process signatures and may not be needed.) The output of the first intelligent system 20 is the ellipsometric and/or interferometric data as a function of time.

In the initial stages of training the first intelligent system 20, the actual ellipsometric and/or interferometric data as a function of time, would be used as target information for teaching. The error is computed as the difference between the actual and the observed output from the first intelligent system 20. This error is used to modify the adjustable parameters of the first intelligent system 20 so as to minimize the error. After many iterations the error has reduced and the first intelligent system 20 can successfully predict the ellipsometric and/or interferometric data as a function of time from the etching machine parameters and process signatures as a function of time. When the first intelligent system 20 has reached this stage of learning, the training can be stopped and the first intelligent system 20 is ready for integration with the second intelligent system 30.

In training a single intelligent system in the relationship between the process signatures and the product attribute as a function of time, it is preferred that the process signatures be collected as discrete traces and measurements of the product attribute be collected offline. The collected date can be used to train an appropriate intelligent system in the relationship between the process signatures and the attribute of the product as a function of time and to use that intelligent system to monitor the product attribute state in real time.

Figure 5:
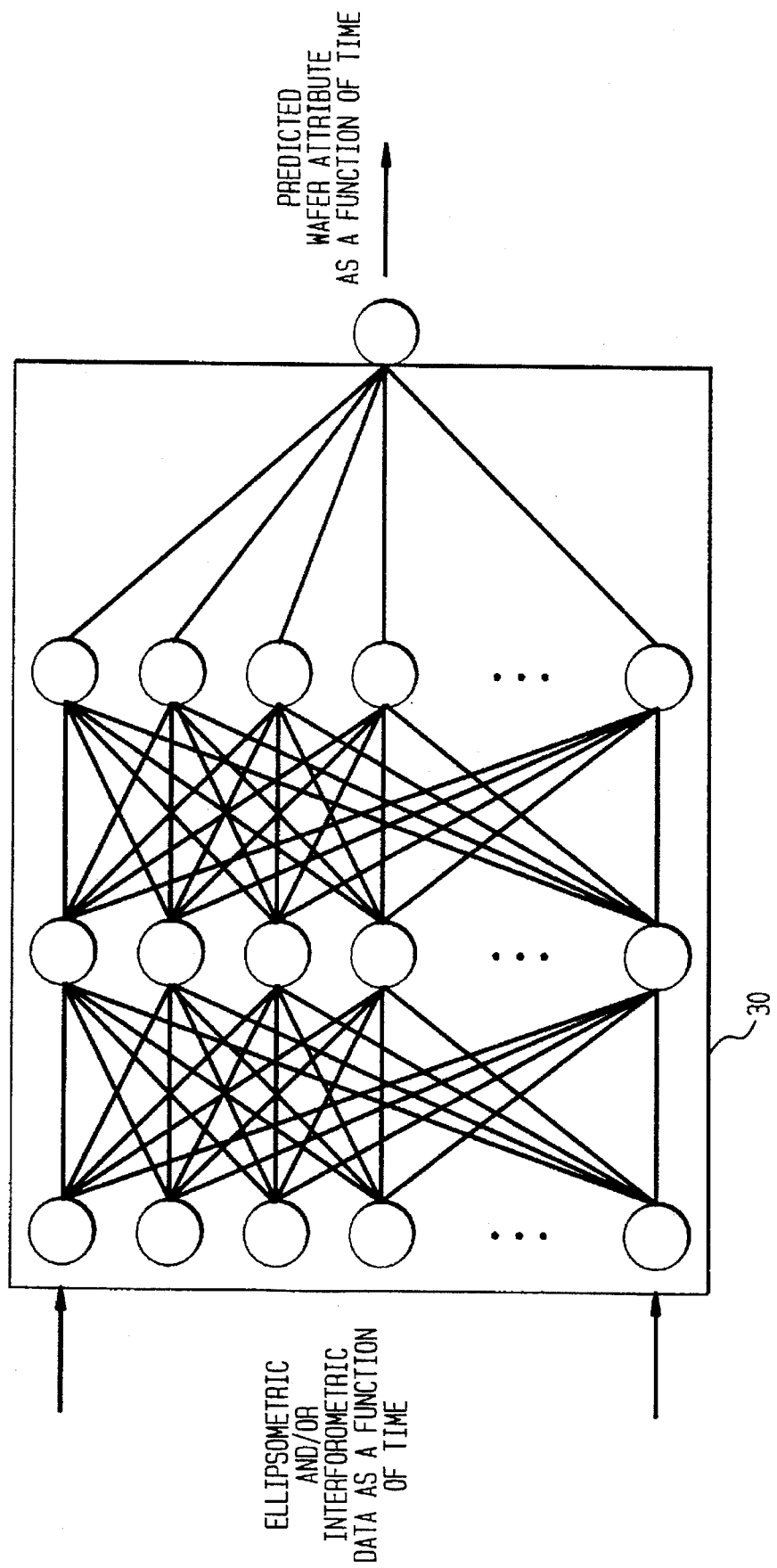
FIG. 5 depicts a neural network as one embodiment of an intelligent system, trained in the relationship between the wafer-state signatures as a function of time and the state of the wafer attribute as a function of time.

As in FIG. 3, FIG. 5 depicts one embodiment of second intelligent system 30 as a three layer neural network. The second intelligent system 30 receives the wafer-state signatures from the output of first intelligent system 20 and outputs the predicted state of the wafer attribute as a function of time. As shown, the specific embodiment of FIG. 5 uses the ellipsometric and/or interferometric data as a function of time to represent the wafer-state signatures and the output represents the thickness of the thin film as a function of time.

Figure 6:
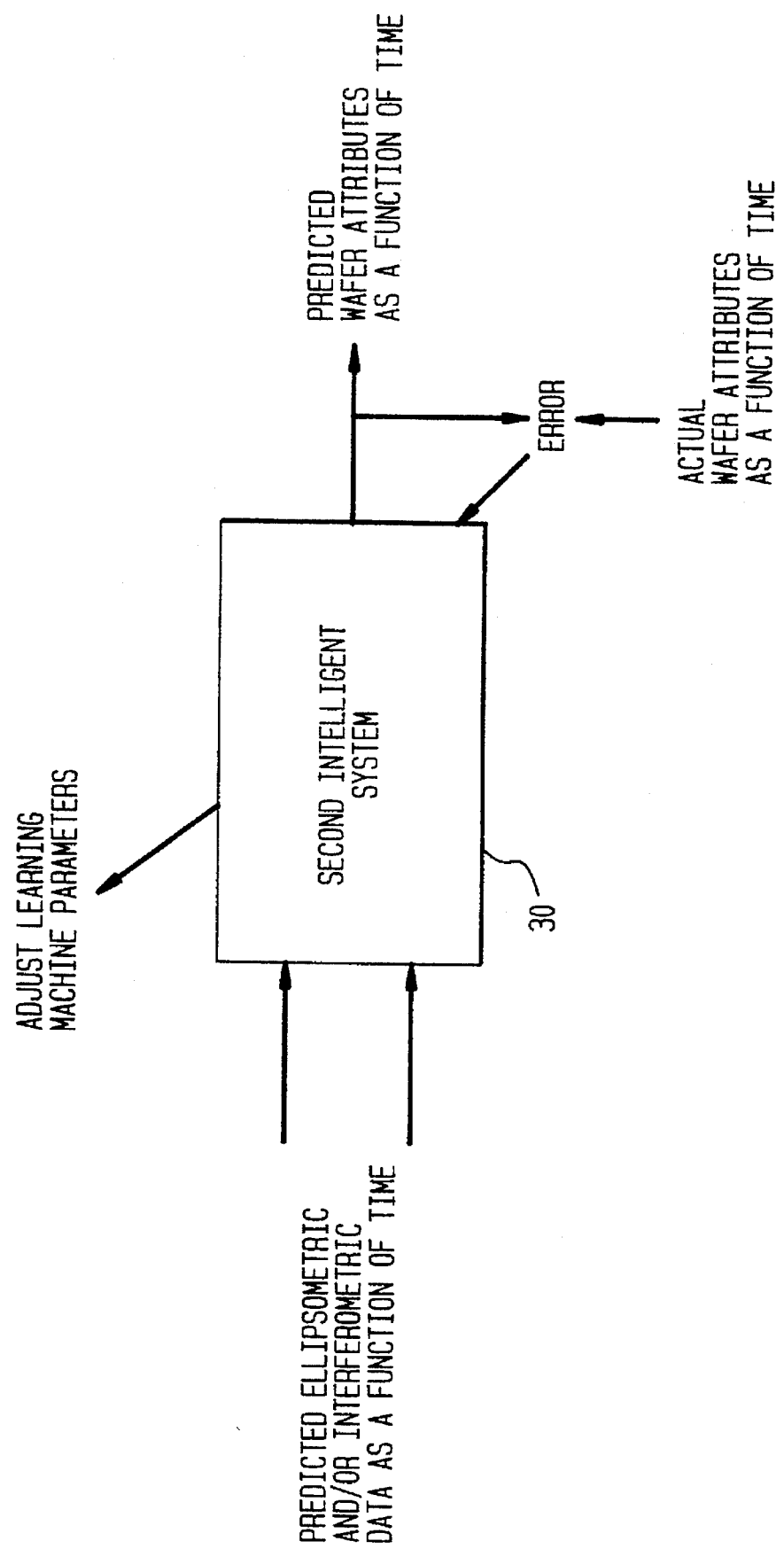
FIG. 6 schematically depicts the intelligent system training in the relationship between the wafer-state signatures as a function of time and the state of the wafer attribute as a function of time.

FIG. 6 shows the training method for the second intelligent system 30 from the real-world database described above. The inputs to the second intelligent system 30 would be the ellipsometric and/or interferometric data as a function of time and its output the predicted wafer attribute (e.g. film thickness, line profile) as a function of time. Like training the first intelligent system 20, the output of the second intelligent system 30 is compared with the actual wafer attributes as a function of time, and an error is computed. This error is used to modify the adjustable parameters of the second intelligent system 30. When a low error has been achieved the second intelligent system 30 is ready to integrate with the first intelligent system 20.

The first and second intelligent systems are combined as shown in FIG. 2. The output of first intelligent system 20 becomes the input to second intelligent system 30 and we thus have a single monitoring system 10 that will compute the wafer attributes in real time, from the etching machine parameters and the etching process signatures, as a function of time. If the database, described above, consists of enough diverse examples, each intelligent system will successfully generalize and be ready for real-world application.

Since the monitoring system will give the wafer attribute (e.g. thickness, profile) as a function of time, the manufacturing process can be stopped at the exact moment for the desired wafer attribute.

Figure 7:
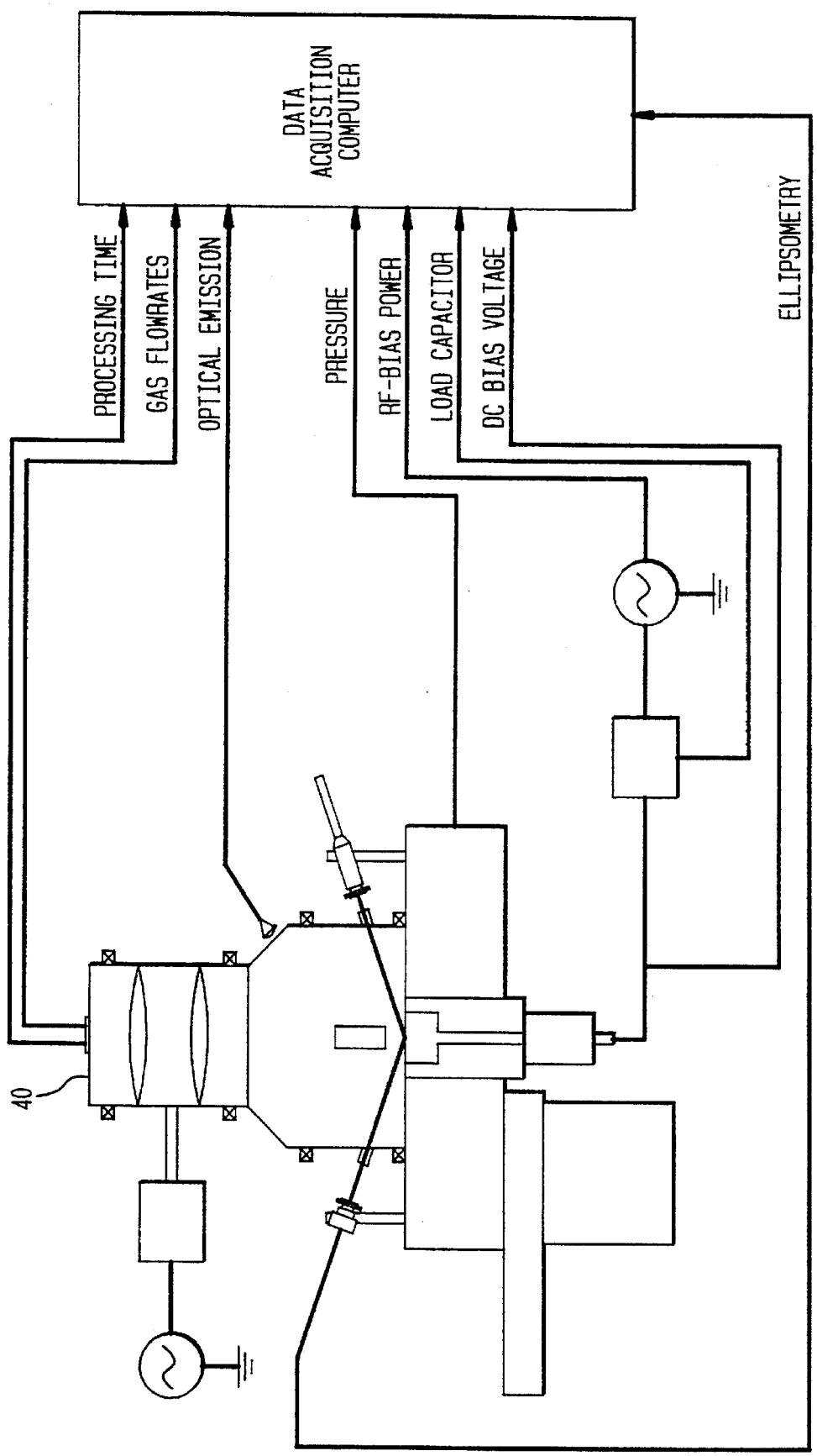
FIG. 7 is a block diagram of a plasma reactor with sensors and diagnostics.

Referring now to FIG. 7, a more specific embodiment of the invention will be described. FIG. 7 is a diagram of the plasma reactor with its sensors and diagnostics. The data acquisition computer collects the gas flow of two gases, the optical emission signal at several wavelengths, the pressure fluctuations, and the fluctuations in RF-bias power, load capacitor value, and dc-bias voltage. These signals are all collected as a function of time, while the reactor is processing the wafer, and constitute the process signatures. In addition, the data acquisition computer collects the ellipsometry signals while the wafer is etching. This ellipsometry signal constitutes the wafer attributes signature, and is the output of the neural network as described above.

Figure 8A:
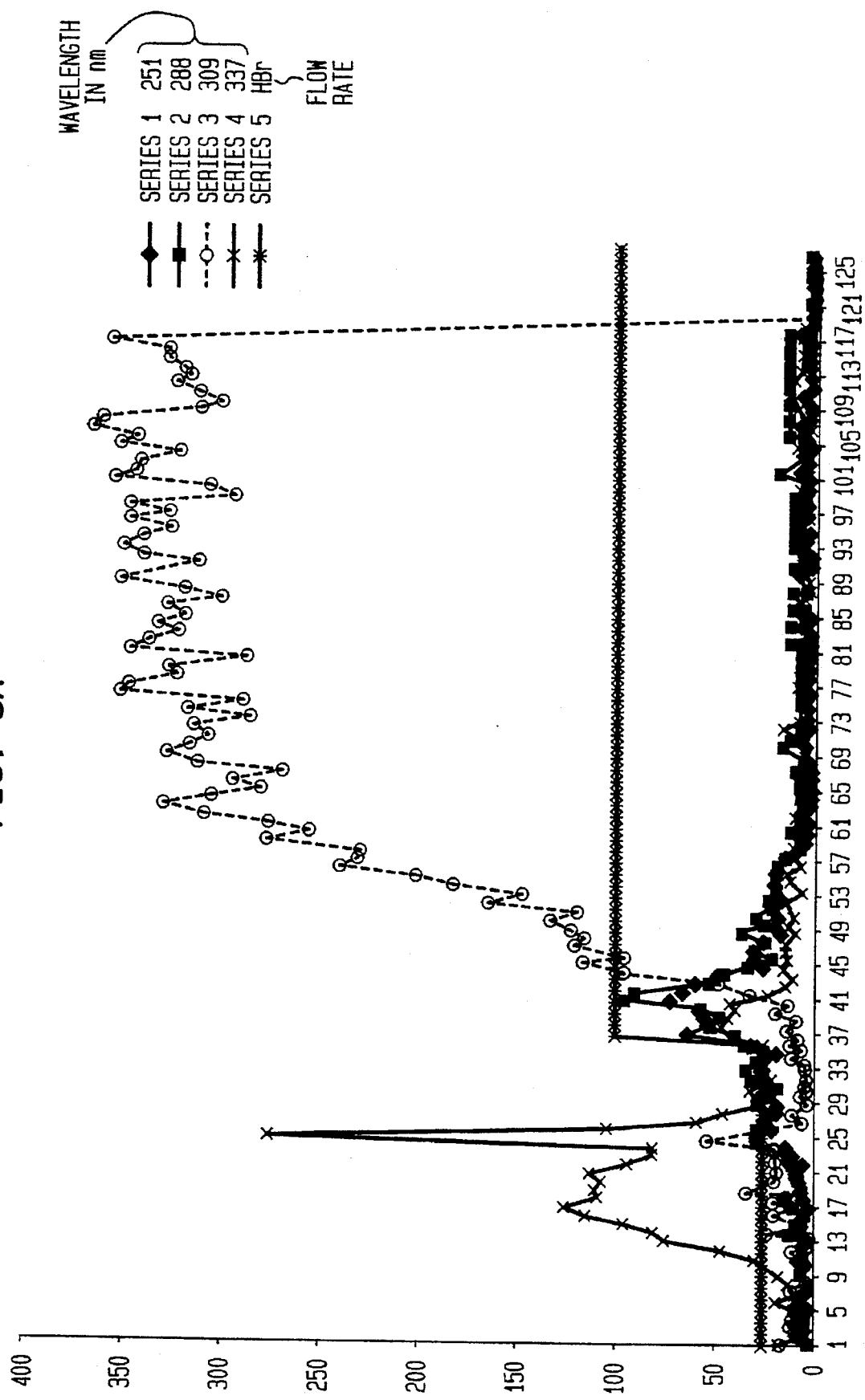
FIGS. 8A and 8B illustrate neural network inputs.
Figure 8B:
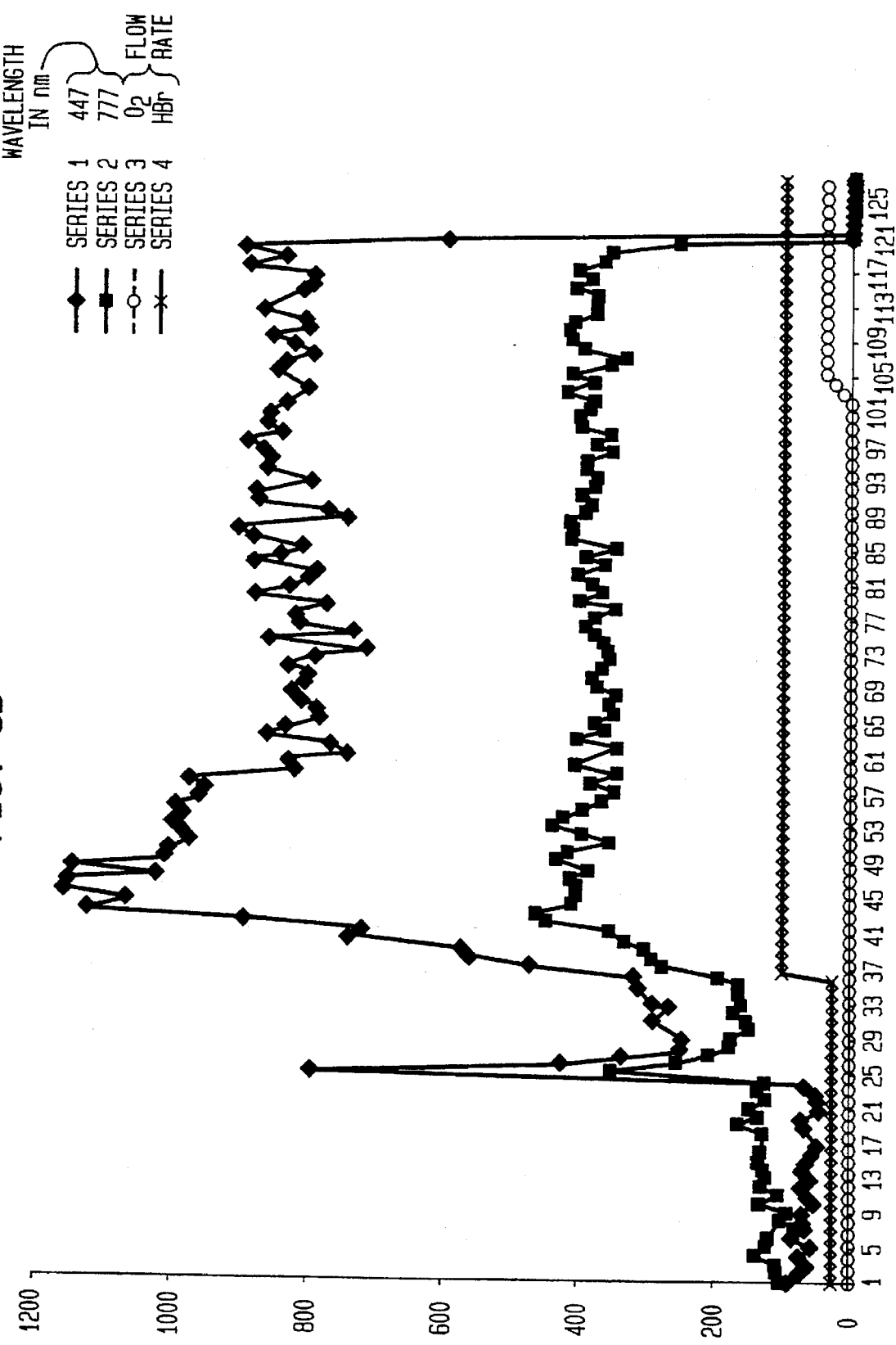

FIGS. 8A and 8B illustrate examples of the process signatures which are inputs to intelligent system 20, which can, for example, be a neural network. FIG. 8A shows the optical emission trace for four wavelengths, 251, 288, 309 and 337 nm, as well as the HBr flow rate trace.

Similarly, FIG. 8B shows the optical emission trace for two wavelengths, 447 and 777 nm, as well as HBr flow rate and the O2 flow rate.

Figure 9A:
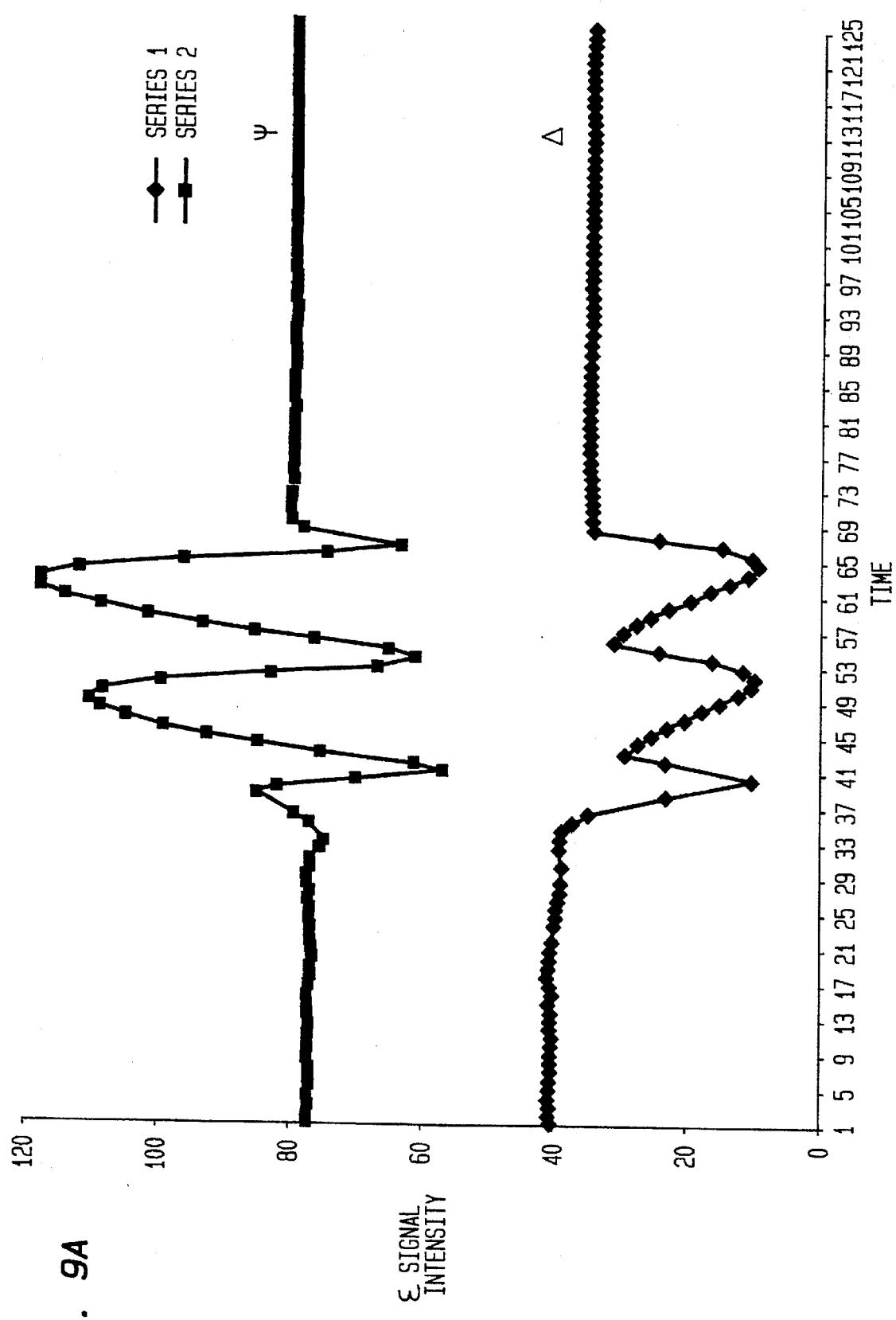
FIGS. 9A and 9B illustrate neural network outputs.
Figure 9B:
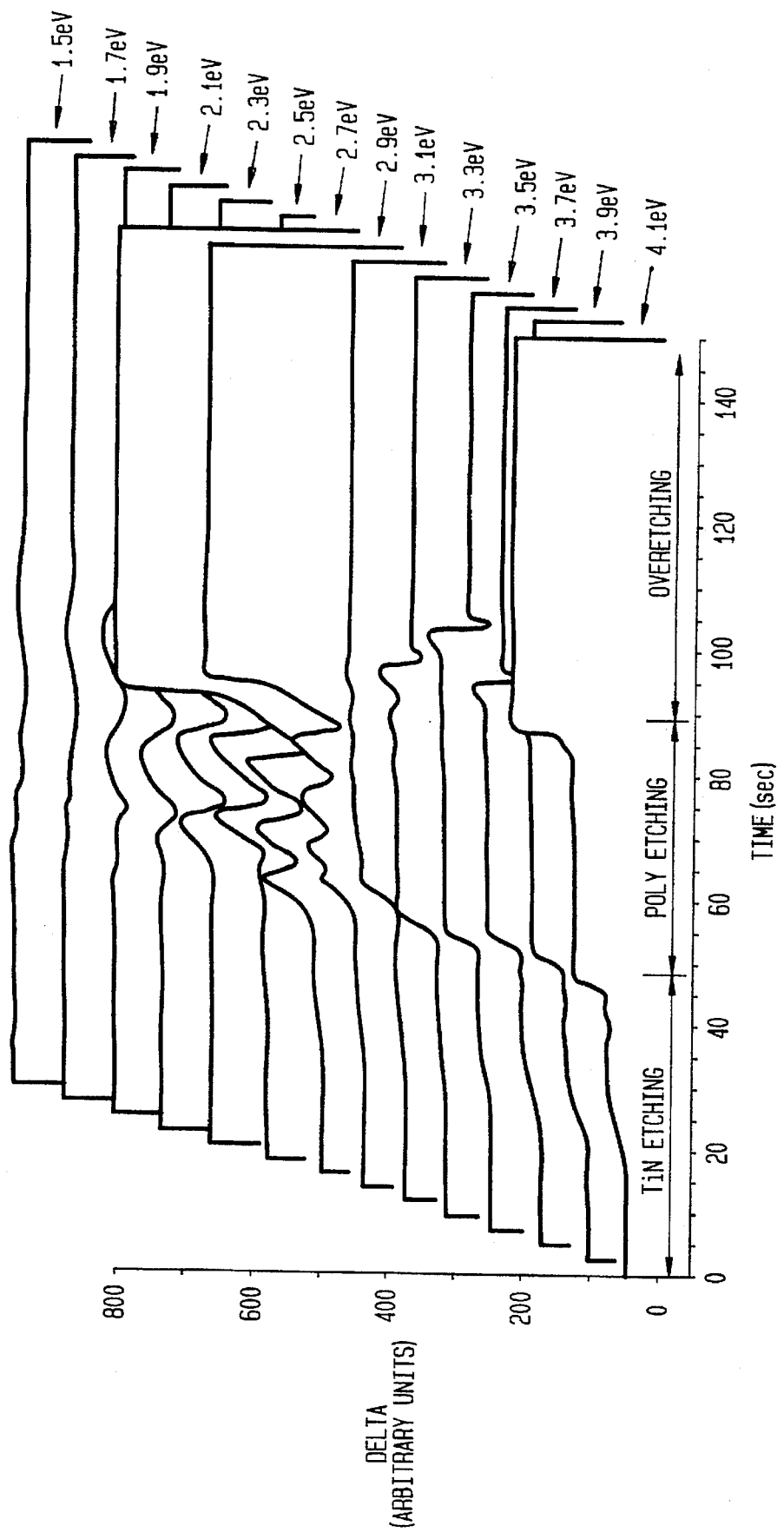

Example outputs of the intelligent system is shown in FIGS. 9A and 9B. FIG. 9A represents ellipsometry traces vs time for two specific neural network outputs, while FIG. 9B represents a full set of delta curves for the ellipsometry traces, which are the outputs of the neural network.

For the specific examples shown, the machine parameters were collected at a specific frequency, call this frequency m. The end result was M data points in M/m seconds. The optical emission data was collected at a specific frequency, call this o, and the total number of data points was O. The time period for this was O/o. Similar for the ellipsometry data, we have e frequency and E data points, so that the time period was E/e. We know that $$M/m = O/o = E e.$$

Using these relations, we can calculate how the data files should be edited. If we take the machine data samples as the standard, we then either have to extend or decrease the sampling frequency of the optical emission and ellipsometry data files. In the case of extending, we interpolate between the actual data and insert an artificial data point. In the case of decreasing the sampling frequency, we find an average between several data points to generate a new curve with essentially the same structure, but fewer data points. In our case, both the optical emission and the ellipsometry data streams were decreased to match the machine parameter data stream. Programs were written to automatically effect this transformation.

Further editing was done by hand. From the beginning and ending of the data streams, the first and last five seconds of data were discarded. The rational was primary interest in mapping the main effects, not effects caused by transients at turn-on or turn-off.

For this example, there were 14 wafers, and data for each wafer consisted of data streams for the machine parameters, the optical emission traces, and the ellipsometry data.

From a machine learning perspective, there were 14 samples for training and evaluation of the machine. Given the data sequences for the 14 samples, the total of the inputs sequences for wafer p can be given as:

$$x_1, x_2, \ldots, x_n = {}^p X$$

This sequence consists of the machine parameters and the optical emissions parameters. The output sequence (the ellipsometry trace) for wafer p can be given as:

$$y_1, y_2, \ldots, y_n = {}^p Y$$

For the 14 samples, we now have the sequence:

$$({}^1 X, {}^1 Y; \ldots ; {}^{14} X, {}^{14} Y)$$

Typically in machine learning, one has far more than 14 samples. In that case, one would randomize the data pairs (X, Y) and split the data base into two files. One file would be used for training and the second for testing. With a large enough sample, both sets of data would have the same statistical distribution.

In this example, there were only 14 samples and, therefore, a method known as leave-one-out cross-validation, was used. The training and testing sequence was as follows: sample one was removed from the data set, and the learning machine only trained on samples 2–14. After the training had converged, the machine was evaluated (cross-validation), with the one sample left out of the training. The results were recorded, and the sample was placed back in the data file. Training and testing continued by leaving out sample number 2, and training on sample 1 and samples 3–14. When the learning process converged, sample number 2 was used in validation of the machine. This process continued until all the samples were evaluated.

Figure 10A:
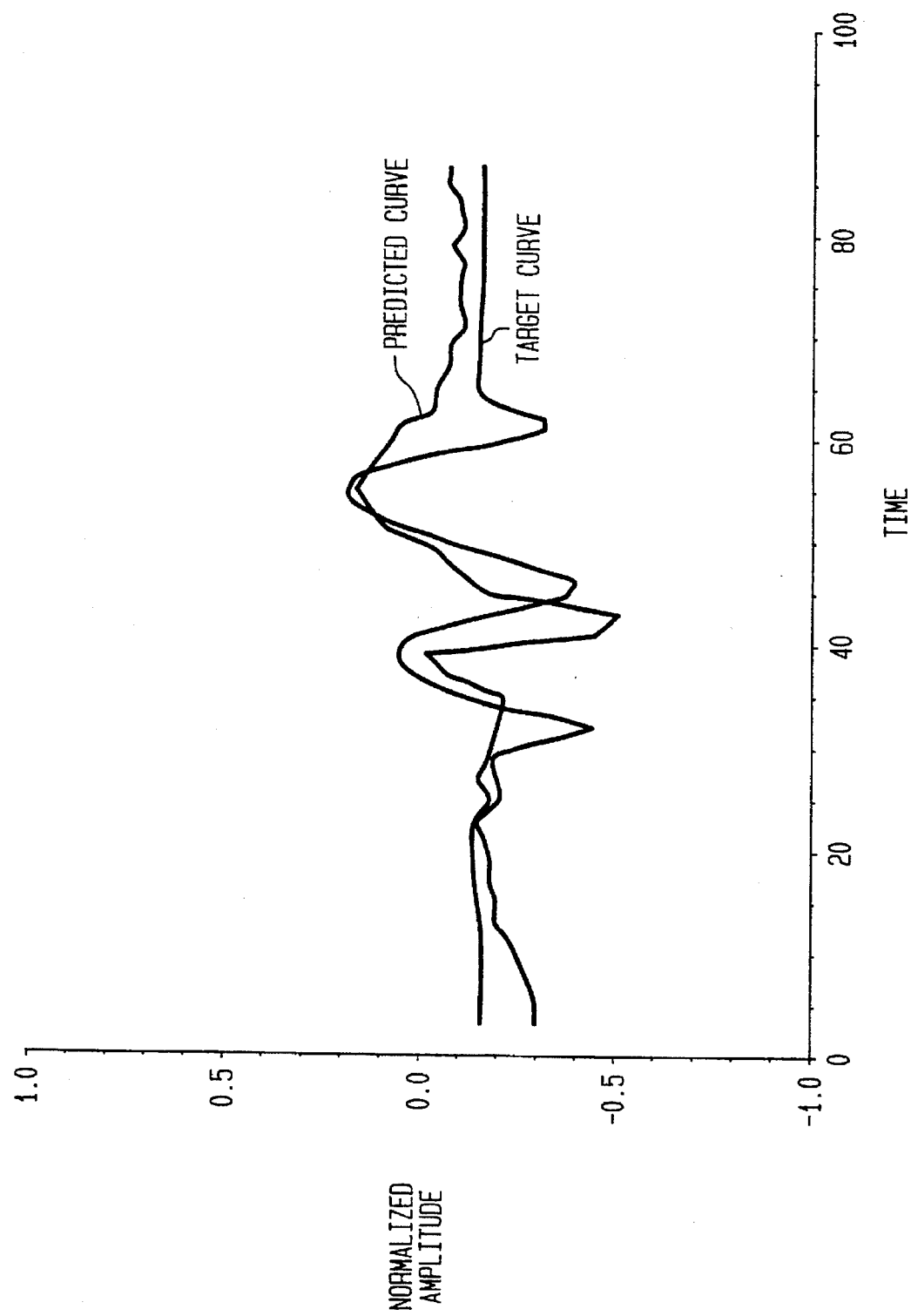

As discussed, the evaluation of the network was conducted by the leave-one-out procedure. The overall cross-validation error was 0.252, essentially the same as the training error. FIGS. 10A and 10B are two examples of the target and response for the neural network production of the letter curve for two ellipsometry traces from the leave-one-out cross validation. Considering the small sample size, the results are impressive. With a more robust data set, the inventive method would clearly reproduce the oscillations of the ellipsometry traces with greater accuracy.

The foregoing merely illustrates the principles of invention. It will thus be appreciated that those seed in the art of the invention will be able to devise various modifications. Accordingly, such modifications, although not explicitly described embody the principles in the invention and are thus within its spirit and scope.

What is claimed is:

1. A method of monitoring in real time, the state of an attribute of a product during the manufacturing process of said product, comprising the steps of:

selecting one or more process signatures which characterize said manufacturing process and which have an indirect relationship to the state of said attribute;

selecting one or more product-state signatures which characterize said attribute;

collecting said process signatures in situ, over a period of time;

inputting said previously collected process signatures to an intelligent system which has been trained in the relationship between said process signatures over a period of time and said product attribute as a function of time, said intelligent system having an output representing said attribute as a function of time; and using said output of said intelligent system to determine when a desired state of said attribute is found and to alter said manufacturing process.

2. A method in accordance with claim 1 wherein said intelligent system comprises two intelligent systems and wherein said inputting step further comprises the steps of:

inputting said previously collected process signatures to a first intelligent system which has been trained in the relationship between said process signatures over a period of time and one or more of said product state signatures as a function of time, said first intelligent system having an output representing one or more of said product state signature; and inputting said output of said first intelligent system into a second intelligent system which has been trained in the relationship between said product state signatures as a function of time and said attribute as a function of time, said second intelligent system having an output representing said attribute as a function of time.

3. A method in accordance with claim 1 wherein said selecting one or more process signatures step includes choosing one or more metrics representative of the material structures of the product.

4. A method in accordance with claim 1 wherein said intelligent system comprises one or more neural networks.

5. A method in accordance with claim 1 wherein said intelligent system comprises one or more recurrent networks.

6. A method in accordance with claim 1 wherein said intelligent system comprises one or more time delay networks.

7. A method in accordance with claim 1 wherein said product is a semiconductor wafer.

8. A method in accordance with claim 7 wherein said semiconductor wafer attribute is the post processing thickness of a film on said semiconductor wafer.

9. A method of monitoring in real time, the state of an attribute of a semiconductor wafer during plasma etch processing, comprising the steps of:

selecting one or more process signatures which characterize said plasma etch process and which have a cause and effect relationship to the state of said attribute;

selecting one or more wafer-state signatures which characterize said attribute;

collecting said process signatures in situ, over a period of time;

inputting said process signatures to an intelligent system which has been trained in the relationship between said process signatures and said attribute as a function of time, said intelligent system having an output representing said attribute as a function of time; and using the output of said intelligent system to determine when a desired state of said attribute is found and to alter said plasma etch process.

10. A method in accordance with claim 9 wherein said intelligent system comprises two intelligent systems and wherein said inputting step further comprises the steps of:

inputting said previously collected process signatures to a first intelligent system which has been trained in the relationship between said process signatures over a period of time and one or more of said product state signatures as a function of time, said first intelligent system having an output representing one or more of said product state signature; and inputting said output of said first intelligent system into a second intelligent system which has been trained in the relationship between said product state signatures as a function of time and said attribute as a function of time, said second intelligent system having an output representing said attribute as a function of time.

11. A method in accordance with claim 9 wherein said wafer-state signature includes the ellipsometric trace of the semiconductor wafer.

12. A method in accordance with claim 9 wherein said wafer-state signature includes the interferometric trace of the semiconductor wafer.

13. A method in accordance with claim 9 wherein said selecting step includes choosing one or more metrics representative of the material structures of the semiconductor wafer.

14. A method in accordance with claim 9 wherein said selecting step includes choosing one or more metrics representative of the pattern density of the semiconductor wafer.

15. A method in accordance with claim 9 wherein said first and second intelligent system comprises one or more neural networks.

16. A method in accordance with claim 9 wherein said intelligent system comprises one or more recurrent networks.

17. A method in accordance with claim 9 wherein said intelligent system comprises one or more time delay networks.

18. A method in accordance with claim 9 wherein said attribute is the post etch thickness of the semiconductor wafer.

19. Apparatus for monitoring in real time, the state of an attribute of a product during the manufacturing process, comprising:

means for collecting one or more process signatures which characterize said manufacturing process and which have an indirect relationship to the state of said attribute;

an intelligent system which has been trained in the relationship between said process signatures and said attribute as a function of time;

input means for inputting said process signatures to said intelligent system over a period of time; and means for creating an output signal from said intelligent system, said output signal containing information for determining when a desired state of the attribute is obtained and to stop said manufacturing process.

20. An apparatus in accordance with claim 19 wherein said intelligence system comprises two intelligent systems and further comprising:

a first intelligent system which has been trained in the relationship between said process signatures and one or more product state signatures which characterize said attribute and whose output represents said one or more product state signatures of said attribute;

input means for inputting said process signatures to said intelligent first system over a period of time;

a second intelligent system which has been trained in the relationship between said product state signatures as a function of time and said attribute as a function of time;

input means for inputting said output of said first intelligent system into said second intelligent system over a period of time; and means for creating an output signal from said second intelligent system, said output signal containing information for determining one of a desired state of the attribute is obtained and to stop said manufacturing process.

21. An apparatus in accordance with claim 19 wherein said intelligent system comprises one or more neural networks.

22. An apparatus in accordance with claim 19 wherein said intelligent system comprises one or more recurrent networks.

23. An apparatus in accordance with claim 19 wherein said intelligent system comprises one or more time delay networks.

24. An apparatus in accordance with claim 19 wherein said product is a semiconductor wafer.

25. An apparatus in accordance with claim 24 wherein said manufacturing process is plasma etch processing.

* * * * *